(12) United States Patent
Balaraman et al.

(10) Patent No.: US 11,239,058 B2
(45) Date of Patent: Feb. 1, 2022

(54) PROTECTIVE LAYERS FOR PROCESSING CHAMBER COMPONENTS

(71) Applicant: Applied Materials, Inc., Santa Clara, CA (US)

(72) Inventors: Karthikeyan Balaraman, Bangalore (IN); Balamurugan Ramasamy, Bangalore (IN); Kartik Shah, Saratoga, CA (US); Mats Larsson, Sunnyvale, CA (US); Kevin A. Papke, Portland, OR (US); Rajasekhar Patibandla, Bangalore (IN); Sathyanarayana Bindiganavale, Bengaluru (IN); Umesh M. Kelkar, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 11 days.

(21) Appl. No.: 16/412,109

(22) Filed: May 14, 2019

(65) Prior Publication Data

US 2020/0020511 A1 Jan. 16, 2020

Related U.S. Application Data

(60) Provisional application No. 62/696,634, filed on Jul. 11, 2018.

(51) Int. Cl.
*H01L 21/285* (2006.01)
*H01L 21/768* (2006.01)
(Continued)

(52) U.S. Cl.
CPC ...... *H01J 37/32477* (2013.01); *C23C 28/042* (2013.01); *H01J 37/32467* (2013.01); *H01J 2237/332* (2013.01); *H01J 2237/334* (2013.01)

(58) Field of Classification Search
CPC ........... H01J 37/32477; H01J 37/32467; H01J 2237/334; H01J 2237/332; C23C 28/042
See application file for complete search history.

(56) References Cited

U.S. PATENT DOCUMENTS

| 5,069,938 A | 12/1991 | Lorimer et al. |
| 5,802,091 A | 9/1998 | Chakrabarti et al. |
| (Continued) | | |

FOREIGN PATENT DOCUMENTS

KR 101322783 B1 10/2013

OTHER PUBLICATIONS

PCT International Search Report and Written Opinion dated Sep. 10, 2019, for International Application No. PCT/US2019/033383.
(Continued)

*Primary Examiner* — Daniel J. Schleis
*Assistant Examiner* — Kevin Ct Li
(74) *Attorney, Agent, or Firm* — Patterson + Sheridan, LLP

(57) ABSTRACT

Embodiments of the present disclosure provide protective coatings, i.e., diffusion and thermal barrier coatings, for aluminum alloy substrates. In particular, embodiments described herein provide a protective layer stack comprising a tantalum nitride layer disposed on an aluminum alloy substrate and a ceramic layer disposed on the tantalum nitride layer. In some embodiments, the aluminum alloy substrates comprise processing chambers and processing chamber components used in the field of electronic device manufacturing, e.g., semiconductor device manufacturing. In one embodiment, an article includes a substrate, a tantalum nitride layer disposed on the substrate, and a ceramic layer disposed on the tantalum nitride layer.

20 Claims, 4 Drawing Sheets

(51) Int. Cl.
  *H01L 21/02*   (2006.01)
  *H01J 37/32*   (2006.01)
  *C23C 28/04*   (2006.01)

(56) References Cited

U.S. PATENT DOCUMENTS

| | | | |
|---|---|---|---|
| 5,914,189 | A | 6/1999 | Hasz et al. |
| 6,261,643 | B1* | 7/2001 | Hasz ............... C23C 28/048 |
| | | | 427/419.1 |
| 6,942,929 | B2 | 9/2005 | Han et al. |
| 7,554,052 | B2 | 6/2009 | Deem et al. |
| 2005/0238807 | A1* | 10/2005 | Lin .................... H01J 9/38 |
| | | | 427/248.1 |
| 2006/0110620 | A1 | 5/2006 | Lin et al. |
| 2008/0038578 | A1 | 2/2008 | Li |
| 2008/0108225 | A1 | 5/2008 | Sun et al. |
| 2010/0272982 | A1* | 10/2010 | Dickinson ............. C23C 4/10 |
| | | | 428/304.4 |
| 2011/0136346 | A1* | 6/2011 | Geissbuhler ...... H01L 21/67069 |
| | | | 438/710 |
| 2012/0141661 | A1* | 6/2012 | Cho ................ H01L 21/6831 |
| | | | 427/58 |
| 2017/0204516 | A1 | 7/2017 | Nguyen et al. |

OTHER PUBLICATIONS

Zaman, Anna—"Characterization of Tantalum Nitride Thin Films Synthesized by Magnetron Sputtering," presented to the faculty of the Graduate School of The University of Texas at Arlington, May 2014, 91 pages.

Abadias, Gregory et al.. Review Article: Stress in thin films and coatings: current status, challenges, and prospects, J. Vac. Sci. Technol. A 36, 020801 (2018); https://doi.org/10.1116/1.5011790, Mar. 5, 2018, 49 pages.

Hutchinson, John W., Stresses and Failure Modes in Thin Films and Multilayers, Technical University of Denmark, Notes for a DCAMM Course, Oct. 1996, 47 pages.

Pellicori, Samuel, Control of Mechanical Stress as Related to Deposition Process, https://materion.com/resource-center/newsletters/coating-materials-news/control-of-mechanical-stress-as-related-to-deposition-process, Dec. 18, 2020, 5 pages.

* cited by examiner

PROTECTIVE LAYERS FOR PROCESSING CHAMBER COMPONENTS

CROSS-REFERENCE TO RELATED APPLICATIONS

This application claims priority to U.S. Provisional Application Ser. No. 62/696,634 filed on Jul. 11, 2018, which is herein incorporated by reference in its entirety.

BACKGROUND

Field

Embodiments of the present disclosure generally relate to the field of protective coatings. In particular, embodiments herein relate to protective layer stacks for processing chambers and chamber components used in the field of semiconductor device manufacturing.

Description of the Related Art

Often, semiconductor device processing equipment and components thereof, such as processing chamber bodies and processing chamber components, are formed of aluminum alloys. The aluminum alloys are selected to provide desirable mechanical and chemical properties, such as tensile strength, density, ductility, formability, workability, weldability, and corrosion resistance. In addition to aluminum, alloys used in processing chamber components typically include non-aluminum elements such as copper, magnesium, manganese, silicon, tin, zinc, or combinations thereof. The non-aluminum elements are chosen to desirably improve the mechanical and, or, chemical properties of the resulting aluminum alloy when compared to pure aluminum. Unfortunately, during workpiece processing, e.g., silicon wafer processing, in the processing chamber, the non-aluminum elements will undesirably migrate from the processing chamber surface or the processing chamber component to other surfaces. For example, often the non-aluminum elements will migrate to surfaces of workpieces processed in the processing chamber resulting in trace metal contamination on the workpiece surface. Trace metal contamination is detrimental to electronic devices, e.g., semiconductor devices, formed on the workpiece, rendering the devices non-functional, contributing to a degradation in device performance, or shortening the usable lifetime thereof.

Conventional methods of preventing migration of non-aluminum elements include coating the aluminum alloy surface with a diffusion and thermal barrier layer, such as by thermally or anodically forming an aluminum oxide ($Al_2O_3$) layer thereon. Often, barrier layers formed on an aluminum alloy surface will tend to wear, crack, or both before the end of the otherwise useful lifetime of the processing chamber or processing chamber component. Wearing and cracking of the barrier layer material generates undesirable particles therefrom and undesirably exposes the aluminum alloy therebeneath. Like the trace metal contamination of the aluminum alloy, these undesirable particles can migrate to the surface of the workpiece and render the devices formed thereon non-functional.

Accordingly, there is a need in the art for improved protective layers for processing chamber surfaces and processing chamber components.

SUMMARY

Embodiments of the present disclosure provide protective coatings, i.e., diffusion and thermal barrier coatings, for aluminum alloy substrates. In particular, embodiments described herein provide a protective layer stack comprising a tantalum nitride layer disposed on an aluminum alloy substrate and a ceramic layer (which is not tantalum nitride) disposed on the tantalum nitride layer. In some embodiments, the aluminum alloy substrate is one or a combination of a processing chamber or processing chamber component used in the field of electronic device manufacturing, e.g., semiconductor device manufacturing.

In one embodiment an article includes a substrate, a tantalum nitride layer disposed on the substrate, and a ceramic layer disposed on the tantalum nitride layer.

In another embodiment a processing component includes a substrate formed of an aluminum alloy, a tantalum nitride layer disposed on the substrate, and an aluminum oxide layer disposed on the tantalum nitride layer.

In another embodiment, a method of forming a protective layer stack includes depositing a tantalum nitride layer on an aluminum alloy substrate and depositing a ceramic layer on the tantalum nitride layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure provide protective coatings, i.e., diffusion and thermal barrier coatings, for aluminum alloy substrates. In particular, embodiments described herein provide a protective layer stack comprising a tantalum nitride layer disposed on an aluminum alloy substrate and a ceramic layer disposed on the tantalum nitride layer. In some embodiments, the aluminum alloy substrate comprises one or a combination of a processing chamber or processing chamber component used in the field of electronic device manufacturing, e.g., semiconductor device manufacturing.

Figure 1:
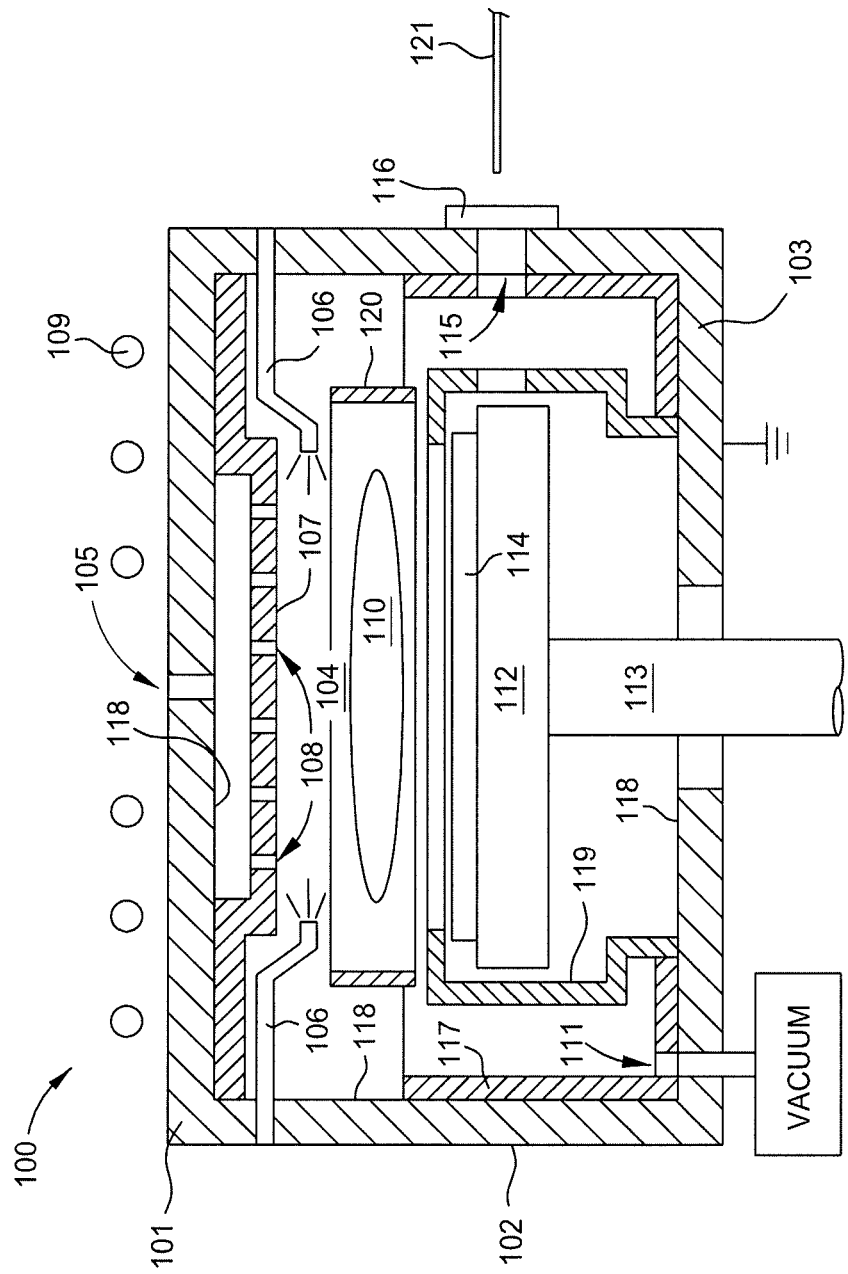
FIG. 1 is a cross-sectional schematic view of an exemplary processing chamber and exemplary processing chamber components, according to one embodiment, which may benefit from the protective layer stacks described herein.

FIG. 1 is a cross-sectional schematic view of an exemplary processing chamber and exemplary processing components used therewith, according to one embodiment. FIG. 1 shows a processing chamber 100 and processing components typically used in or with plasma enhanced deposition chambers and plasma enhanced etch chambers. However, it is contemplated that the protective layer stacks described herein may be used on any substrate surface where a wear resistant thermal and diffusion barrier is desired.

The processing chamber 100 features a chamber body which includes a chamber lid 101, one or more sidewalls 102, and a chamber base 103 which collectively define a processing volume 104. Typically, processing gases are delivered to the processing volume 104 though an inlet 105 disposed through the chamber lid 101, through one or more gas injectors 106 disposed through the one or more sidewalls 102, or both. In some embodiments, the chamber lid 101 includes a showerhead 107, having a plurality of openings 108 disposed therethrough, which is used to uniformly distribute processing gases into the processing volume 104.

Here, the processing chamber 100 features an inductively coupled plasma (ICP) generator comprising one or more inductive coils 109 disposed proximate to the chamber lid 101 outside of the processing volume 104. The ICP generator is used to ignite and maintain a plasma 110 from the processing gases using an electromagnetic field generated by the inductive coils 109. In other embodiments, the plasma generator is a capacitively coupled plasma (CCP) generator or a microwave plasma generator. In some other embodiments, a plasma is generated remotely from the processing volume 104 using a remote plasma source (not shown) before being delivered theretinto.

Here, the processing volume 104 is fluidly coupled to a vacuum source, such as to one or more dedicated vacuum pumps, through a vacuum outlet 111, which maintains the processing volume 104 at sub-atmospheric conditions and evacuates the processing gas and other gases therefrom. A workpiece support 112, disposed in the processing volume 104, is disposed on a movable support shaft 113 sealingly extending through the chamber base 103, such as being surrounded by bellows (not shown) in the region below the chamber base 103. Here, the processing chamber 100 is configured to facilitate transferring of a workpiece 114 to and from the workpiece support 112 through an opening 115 in one of the one or more sidewalls 102, which is sealed with a door 116 or a valve during workpiece processing.

The processing chamber 100 includes one or more removable liners 117 disposed on and radially inward from one or more interior surfaces 118 of the chamber body. The processing chamber 100 further includes one or more shields, such as the first shield 119 circumscribing the workpiece support 112 and support shaft 113 and a second shield 120 disposed radially inward from the one or more sidewalls 102. Herein, the shields 119 and 120 are used confine the plasma 110 to a desired region in the processing volume 104, to define flow pathways for gases in the processing volume 104, or combinations thereof. In some embodiments, the workpiece 114 is transferred into and out of the processing volume using a robot end effector, e.g., a robot vacuum wand 121. In embodiments herein, one or more of the components described above, i.e., the chamber body and processing components disposed therein or used therewith are formed of an aluminum alloy and comprise a protective coating, such as the protective layer stack described in FIGS. 2A-2D.

Figure 2A:
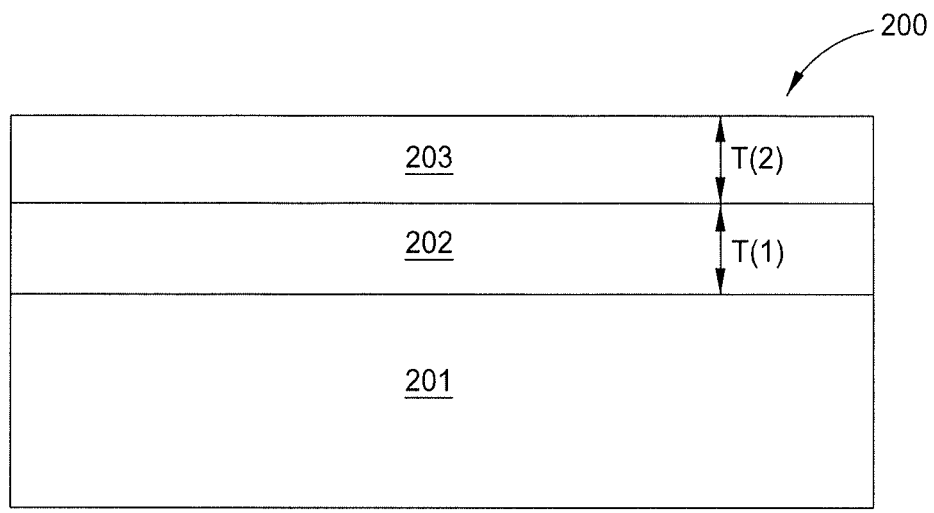
FIG. 2A-2D illustrate various protective layer stacks formed on a substrate, according to embodiments describe herein.

FIG. 2A illustrates a protective layer stack 200 formed on a substrate 201, according to one embodiment. Typically, the substrate 201, or a surface thereof, is formed of an alloy comprising aluminum and one or more of chromium, copper, iron, magnesium, manganese, silicon, tin, and zinc. For example, in some embodiments, the substrate 201 is formed of a 6061 T6 aluminum alloy having a composition set forth in Table 1.

TABLE 1

| Component | Wt. % |
|---|---|
| Al | 95.8-98.6 |
| Cr | 0.04-0.35 |
| Cu | 0.15-0.4 |
| Fe | <0.7 |
| Mg | 0.8-1.2 |
| Mn | <0.15 |
| Si | 0.4-0.8 |
| Ti | <0.15 |
| Zn | 0.25 |

Here, the protective layer stack 200 includes a tantalum nitride layer 202 disposed on the substrate 201 and a ceramic layer 203 disposed on the tantalum nitride layer 202. In some embodiments, the ceramic layer 203 comprises one or a combination of aluminum oxide ($Al_2O_3$), aluminum nitride (AlN), titanium oxide (TiO), titanium nitride (TiN), and yttrium oxide ($Y_2O_3$). In some embodiments, the ceramic layer 203 comprises aluminum oxide. Here, the tantalum nitride layer 202 has a first thickness T(1) of less than about 10 μm, such as less than about 1 μm, less than about 500 nm for example less than about 250 nm. In some embodiments the first thickness T(1) of the tantalum nitride layer 202 is between about 10 nm and about 10 μm, such as between about 10 nm and about 1 μm, between about 10 nm and about 500 nm, or between about 10 nm and about 250 nm. In some embodiments, the ceramic layer 203 has a second thickness T(2) of between about 10 nm and about 10 μm. Typically, a ratio of the thickness T(1) of the tantalum nitride layer to the thickness T(2) of the ceramic layer T(2) is between about 5:1 and 1:5, such as between about 2:1 and 1:5, between about 2:1 and about 1:3, between about 1:1 and 1:5, between about 1:1 and about 1:3, for example about 1:2. In one embodiment the tantalum nitride layer has a thickness T(1) of between about 10 nm and about 250 nm and a thickness ratio of T(1) to T(2) is between about 1:1 and about 1:3.

In some embodiments, a compressive (+) or tensile (−) internal stress of the as deposited tantalum nitride layer 202 is less than about +/−1000 MPa, such as less than about +/−900 MPa, less than about +/−800 MPa, less than about +/−700 MPa, for example less than about +/−600 MPa. In some embodiments, the internal stress of the as deposited tantalum nitride layer 202 is tensile. In some embodiments, a compressive or tensile internal stress of the as deposited ceramic layer 203 is less than about +/−1000 MPa, such as less than about +/−900 MPa, less than about +/−800 MPa, less than about +/−700 MPa, less than about +/−600 MPa, such as less than about +/−500 MPa. In some embodiments, the internal stress of the as deposited ceramic layer 203 is compressive.

The processing chambers and processing components described herein are exposed to repeated thermal cycles from an ambient (room) temperature of between about 20° C. and about 25° C. to a higher operational temperature of between about 100° C. and about 400° C. or more during workpiece processing operations. In some embodiments, the higher operational temperature is 400° C. or less, such as 300° C. or less, 200° C. or less, 150° C. or less, for example 100° C. or less. These repeated thermal cycles can induce changes in the internal stresses of the protective layer stack 200 from the stresses of the as deposited layers described above. Therefore, in some embodiments the internal stress in the ceramic layer 203 after one or more thermal cycles from ambient temperature to the higher operational temperature is less than about +/−400 MPa, for example less than about +/−300 MPa.

In some embodiments, a shear stress of the tantalum nitride layer 202 after one or more thermal cycles is less than about 500 MPa, such as less than about 400 MPa, for example less than about 300 MPa. In some embodiments, a shear stress of the ceramic layer 203 after one or more thermal cycles is less than less than about 500 MPa, such as less than about 400 MPa, less than about 300 MPa, less than about 200 MPa, or less than about 100 MPa.

Figure 2B:
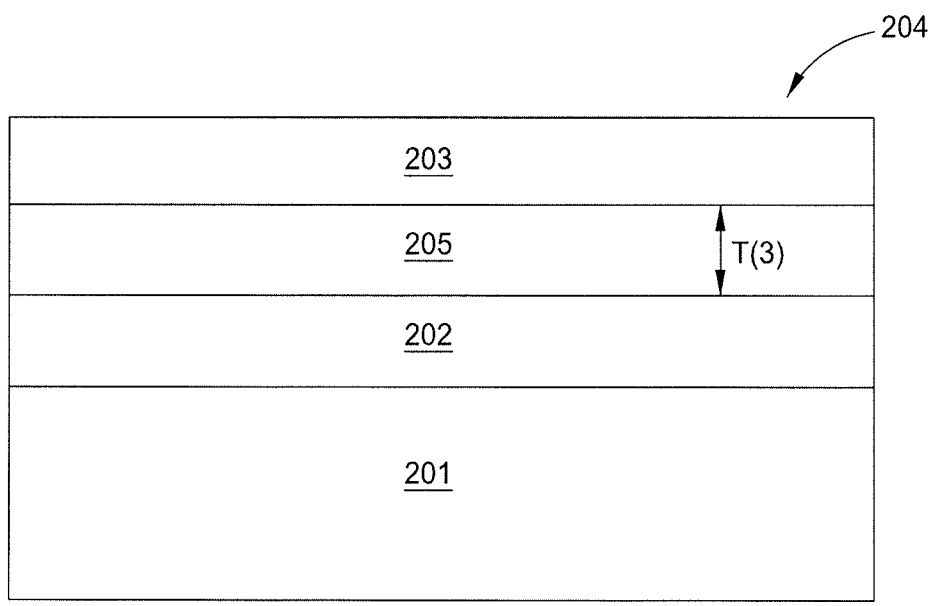

FIG. 2B illustrates a protective layer stack 204 formed on the substrate 201, such as a processing component described in FIG. 1, according to another embodiment. Here, the protective layer stack 204 includes the substrate 201, the tantalum nitride layer 202, and the ceramic layer 203 described in FIG. 2A and further includes a tantalum layer 205 interposed between the tantalum nitride layer 202 and the ceramic layer 203. Typically, a ratio of the thickness T(3) of the tantalum layer 205 to the thickness T(2) of the tantalum nitride layer T(1) is between about 1:5 and about 5:1, such as between about 1:3 to about 3:1, for example between about 1:2 and 2:1.

Figure 2C:
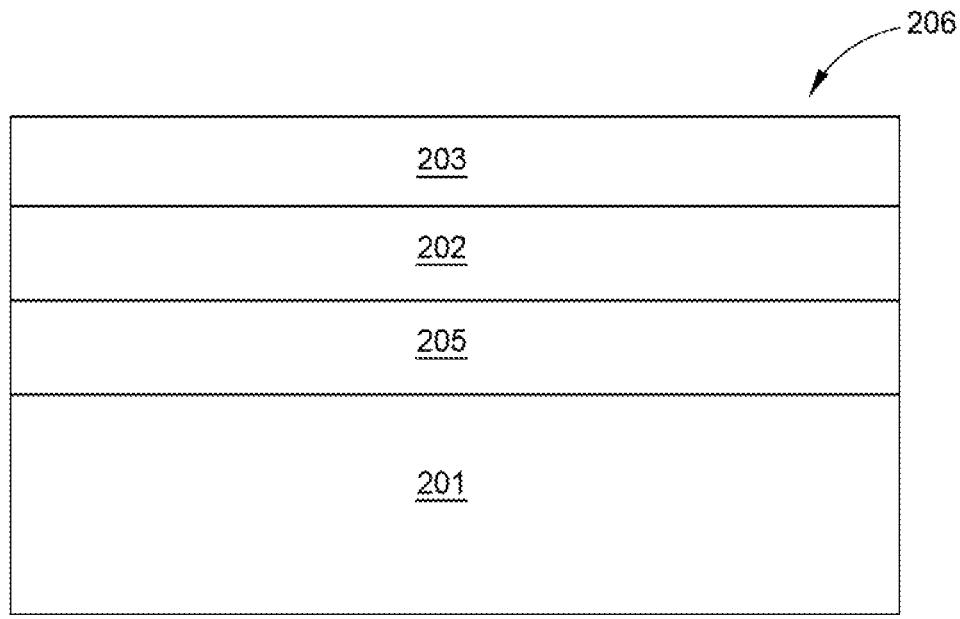

FIG. 2C illustrates a protective layer stack 206 formed on the substrate 201, such as a processing component described in FIG. 1, according to another embodiment. Here, the protective layer stack 206 includes the substrate 201, the tantalum nitride layer 202, and the ceramic layer 203 described in FIG. 2A and further includes the tantalum layer 205 described in FIG. 2B interposed between the substrate and the tantalum nitride layer.

Figure 2D:
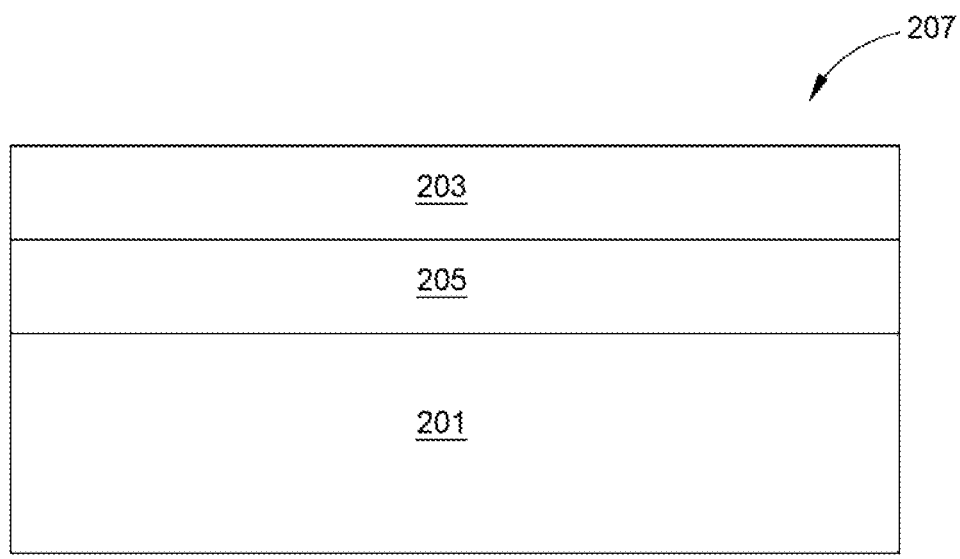

FIG. 2D illustrates a protective layer stack 207 formed on the substrate 201, such as a processing component described in FIG. 1, according to another embodiment. Here, the protective layer stack 207 includes the substrate 201, the tantalum layer 205, and the ceramic layer 203 described in FIGS. 2A-C, where the tantalum layer 205 is interposed between the substrate 201 and the ceramic layer 203.

Figure 3:
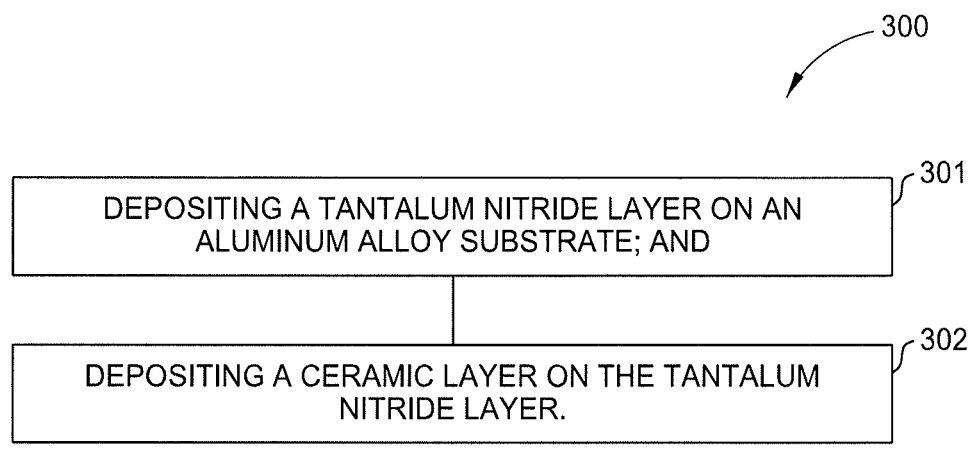
FIG. 3 is a flow diagram setting forth a method of depositing a protective layer stack on a substrate, according to one embodiment.

FIG. 3 is a flow diagram setting forth a method of forming a protective layer stack on a substrate, according to one embodiment. At activity 301 the method 300 includes depositing a tantalum nitride layer on an aluminum alloy substrate. At activity 302 the method 300 includes depositing a ceramic layer on the tantalum nitride layer. In some embodiments, the tantalum nitride layer is deposited using one or a combination of a chemical vapor deposition (CVD) process, a physical vapor deposition (PVD) process, or an atomic layer deposition (ALD) process. In some embodiments, the tantalum nitride layer is deposited using a plasma enhanced (PE) deposition process, i.e., a PECVD, a PEPVD, or a PEALD process.

In one embodiment, the tantalum nitride layer is deposited using an ALD process comprising alternating exposure of the substrate to a tantalum containing precursor and a nitrogen precursor. Examples of suitable tantalum precursors include t-butylimino-tris(diethylamino)tantalum, pentakis (ethylmethylamino)tantalum, pentakis(dimethylamino) tantalum (PDMAT), pentakis (diethylamino)tantalum, t-butyliminotris(diethyl methylamino)tantalum, t-butylimino-tris(dimethylamino)tantalum, bis(cyclopentadienyl) tantalum trihydride, bis(methylcyclopentadienyl) tantalum trihydride, or combinations thereof. Examples of suitable nitrogen containing precursors include ammonia, hydrazine, methylhydrazine, dimethylhydrazine, t-butyihydrazine, phenylhydrazine, azoisobutane, ethylazide, and combinations thereof.

In some embodiments, the ceramic layer is deposited using one or a combination of a CVD process, a PVD process, and ALD process, or a spray coating process. In some embodiments, the ceramic layer is deposited using a plasma enhanced deposition process, i.e., a PECVD, a PEPVD, a PEALD, or a plasma enhanced spray coating process. In one embodiment, the ceramic layer comprises aluminum oxide deposited using an ALD process comprising alternating exposure of the substrate to an aluminum containing precursor, such as trimethylaluminum (TMA: (CH3)3AL), and oxygen.

The method 300 may be used to form any one or combination of protective layer stacks described in FIGS. 2A-2D on any one or a combination of processing components, such as the chamber body, and the processing components disposed therein or used therewith, described in FIG. 1.

In some embodiments, the substrate is maintained at less than about 150° C. during the deposition of one or both of the tantalum nitride layer and the ceramic layer, such as less than about 120° C., for example about 100° C. or less.

The method 300 beneficially provides for a wear resistant protective coating comprising a diffusion barrier layer of tantalum nitride and a thermally insulative $Al_2O_3$ layer disposed thereon.

While the foregoing is directed to embodiments of the present disclosure, other and further embodiments of the disclosure may be devised without departing from the basic scope thereof, and the scope thereof is determined by the claims that follow.

The invention claimed is:

1. An article, comprising:
   an aluminum alloy substrate for use in a plasma processing chamber, the aluminum alloy substrate comprising one of a gas injector, a showerhead, a chamber liner, or a shield;
   a tantalum layer disposed on the aluminum alloy substrate;
   a tantalum nitride layer disposed on the tantalum layer; and
   an aluminum oxide layer disposed on the tantalum nitride layer.

2. The article of claim 1, wherein the aluminum alloy substrate comprises one of chromium, copper, iron, magnesium, manganese, silicon, tin, zinc, or a combination thereof.

3. The article of claim 2, wherein the aluminum alloy substrate is formed of a 6061 aluminum alloy.

4. The article of claim 1, wherein a thickness of the tantalum nitride layer is between 10 nm and 250 nm.

5. The article of claim 4, wherein a ratio of the thickness of the tantalum nitride layer to a thickness of the aluminum oxide layer is between 1:1 and 1:3.

6. The article of claim 1 wherein the aluminum alloy substrate comprises the chamber liner.

7. A processing component, comprising:
   a chamber body formed of an aluminum alloy;
   a tantalum layer disposed on an interior surface of the chamber body;
   a tantalum nitride layer disposed on the tantalum layer; and
   an aluminum oxide layer disposed on the tantalum nitride layer.

8. The processing component of claim 7, wherein the aluminum alloy comprises one of chromium, copper, iron, magnesium, manganese, silicon, tin, zinc, or a combination thereof.

9. The processing component of claim 8, wherein the chamber body is formed of a 6061 aluminum alloy.

10. The article of claim 1, wherein the aluminum alloy substrate comprises the chamber liner.

11. An article, comprising:
an aluminum alloy substrate for use in a plasma processing chamber, the aluminum alloy substrate comprising one of a gas injector, a showerhead, a chamber liner, or a shield;
a tantalum nitride layer disposed on the aluminum alloy substrate;
a tantalum layer disposed on the tantalum nitride layer; and
an aluminum oxide layer disposed on the tantalum layer.

12. The article of claim 1, wherein an internal stress in the aluminum oxide layer is within a range from −500 MPa to 500 MPa.

13. The article of claim 12, wherein an internal stress in the tantalum nitride layer is within a range from 0 MPa to −500 MPa.

14. The article of claim 1, wherein a thickness of the tantalum nitride layer is between 10 nm and 250 nm, a ratio of the thickness of the tantalum nitride layer to a thickness of the aluminum oxide layer is between 1:1 and 1:3, and a ratio of a thickness of the tantalum layer to the thickness of the tantalum nitride layer is between 1:2 and 2:1.

15. A processing article, comprising:
an aluminum alloy substrate comprising an interior surface of a plasma processing chamber or a processing component for use in the plasma processing chamber; and
a protective layer stack disposed on a surface of the aluminum alloy substrate, the protective layer stack comprising:
a tantalum layer;
a tantalum nitride layer; and
a ceramic layer consisting essentially of aluminum oxide.

16. The processing component of claim 15, wherein an internal stress in the ceramic layer is within a range from −500 MPa to 500 MPa.

17. The processing component of claim 16, wherein an internal stress in the tantalum nitride layer is within a range from 0 MPa to −600 MPa.

18. The processing component of claim 17, wherein the tantalum nitride layer has a thickness of between about 10 nm and about 250 nm.

19. The processing component of claim 18, wherein a ratio of the thickness of the tantalum nitride layer to a thickness of the ceramic layer is between 1:1 and 1:3.

20. The processing component of claim 15, wherein a ratio of a thickness of the tantalum nitride layer to a thickness of the tantalum layer is between 1:5 and 5:1.

* * * * *